United States Patent [19]

Stevens et al.

[11] Patent Number: 5,292,682
[45] Date of Patent: Mar. 8, 1994

[54] METHOD OF MAKING TWO-PHASE CHARGE COUPLED DEVICE

[75] Inventors: Eric G. Stevens; Stephen L. Kosman, both of Rochester; Paul L. Roselle, Webster, all of N.Y.

[73] Assignee: Eastman Kodak Company, Rochester, N.Y.

[21] Appl. No.: 86,072

[22] Filed: Jul. 6, 1993

[51] Int. Cl.$^5$ .......................................... H01L 21/339
[52] U.S. Cl. .................................... 437/53; 437/962; 148/DIG. 131
[58] Field of Search .......................... 437/50, 53, 962; 148/DIG. 51, DIG. 106, DIG. 131

[56] References Cited

U.S. PATENT DOCUMENTS

| | | | |
|---|---|---|---|
| 3,853,634 | 12/1974 | Amelio et al. | 437/53 |
| 3,911,560 | 10/1975 | Amelio et al. | 437/53 |
| 4,133,099 | 1/1979 | Hagiwara | 437/53 |
| 4,574,468 | 3/1986 | Slotboom et al. | 437/186 |
| 4,613,402 | 9/1986 | Losee et al. | 437/53 |
| 4,696,098 | 9/1987 | Yen | 148/DIG. 51 |
| 4,746,622 | 5/1988 | Hawkins et al. | 437/53 |
| 4,807,004 | 2/1989 | Wan et al. | 437/53 |
| 4,992,392 | 2/1991 | Nichols et al. | 437/53 |
| 4,994,405 | 2/1991 | Jayakar | 437/53 |
| 5,032,221 | 7/1991 | Roselle et al. | 156/643 |
| 5,114,833 | 5/1992 | Erhardt | 437/53 |
| 5,240,873 | 8/1993 | Shinji | 437/53 |

OTHER PUBLICATIONS

Charge-Coupled Devices With Submicron Gaps by V. J. Kapoor, IEEE Electron Device Letters, vol. ED-L-2, No. 4, p. 92, Apr. 1981.

Primary Examiner—Brian E. Hearn
Assistant Examiner—C. Chaudhari
Attorney, Agent, or Firm—Raymond L. Owens

[57] ABSTRACT

A method of making a two-phase charge coupled device (CCD) includes forming a layer of a conductive material over and insulated from the surface of a body of a semiconductor material of one conductivity type having a channel region of the opposite conductivity type in the body and extending to the surface. Sections of a first masking layer are formed on the conductive material layer spaced along the channel region. A conductivity modifying dopant is implanted into the channel region through the spaces between the sections of the first masking layer. A layer of a second masking layer is formed over the sections of the first masking layer and on the surface of the conductive material layer in the spaces between the sections of the first masking layer. A layer of indium-tin oxide (ITO) is formed over the portions of the second masking layer which extend across the ends of the sections of the first masking layer, and a layer of carbon is formed on the second masking layer between the ITO layers. The ITO layers along the ends of the sections of the first masking layer are then removed, and exposed portions of the second masking layer are removed. The portions of the conductive material layer under the removed portions of the second masking layer are then removed so as to leave the conductive material layer divided into individual very closely spaced apart (submicron spacing) gate electrodes.

16 Claims, 3 Drawing Sheets

METHOD OF MAKING TWO-PHASE CHARGE COUPLED DEVICE

CROSS-REFERENCE TO RELATED APPLICATIONS

Reference is made to commonly assigned U.S. patent application Ser. Nos. 945,073, filed Sep. 15, 1992 entitled "Method of Making a Single Electrode Level CCD" by J. P. Lavine; U.S. patent application Ser. No. 995,393, filed Dec. 18, 1992 entitled "Method of Making Two-Phase Buried Channel Planar Gate CCD" by Eric G. Stevens et al and U.S. patent application Ser. No. 08/073,211, filed Jun. 7, 1993 entitled "Low Temperature Insitu Image Reversal Process for Microelectronic Fabrication" by Paul L. Roselle et al, the teachings of which are incorporated herein.

FIELD OF THE INVENTION

The present invention is directed to a method of making a two-phase charge coupled device (CCD), and, more particularly, to a method of making a true two-phase CCD having a planar gate electrode structure.

BACKGROUND OF THE INVENTION

A CCD, in general, comprises a body of a semiconductor material, such as single crystalline silicon, having a channel region in and along a surface of the body. A layer of an insulating material, typically silicon dioxide, is on the surface of the body and over the channel region. A plurality of conductive gate electrodes, typically of doped polycrystalline silicon, are on the insulating layer and extend across the channel region. The gate electrodes are positioned along the entire length of the channel region.

In a two-phase CCD, the gate electrodes are arranged in two sets which alternate along the channel region. The gate electrodes of one set are connected to a first phase potential, and the gate electrodes of the other set are connected to a second phase potential. A true two-phase CCD also typically includes in the body a barrier region under an edge of each of the gate electrodes and extending across the channel region. The barrier regions prevent the charge from moving backwards along the channel region.

The two sets of gate electrodes could be formed from a single layer of the conductive material by depositing the single layer and defining it by photolithography and etching to form the spaced gate electrodes along the channel region. However, using commercial type photolithographic and etching techniques and equipment, it is difficult to form the gate electrodes having very narrow submicron gaps therebetween with the gaps being uniform across the entire width of the gate electrodes. Since relatively wide and/or non-uniform gaps can form potential barriers and/or wells between the gate electrodes, they can interfere with the transfer of charge from one gate electrode to the next. Therefore, it has been the practice to form the gate electrodes from two separate levels (layers) of the conductive material.

For a two level system, a first layer of the conductive material is deposited and defined to form one set of the gate electrodes. The first set of gate electrodes are then covered with a layer of an insulating material, typically silicon dioxide. A second layer of the conductive material is then deposited over the first set of gate electrodes and the gaps between the first set of gate electrodes. The second layer of the conductive material is then defined to form the second set of gate electrodes which are between the gate electrodes of the first set. Also, each of the gate electrodes of the second set overlaps the adjacent gate electrodes of the first set. U.S. Pat. No. 4,613,402 (Losee et al.), issued Sep. 23, 1986, and U.S. Pat. No. 3,853,634 (Amelio et al.), issued Dec. 10, 1974, each describes a method of making a two-phase CCD having a two level gate electrode structure. Since the gate electrodes overlap each other, there are no gaps therebetween which can form undesirable potential barriers and/or wells. However, two level gate electrode structure is non-planar since portions of the second set of electrodes extend over the first set of electrodes. Also, there exists undesirable capacitance between the two sets of gate electrodes where they overlap.

Heretofore, submicron-gap, planar gate CCD structures have been reported, but they have been primarily three or four-phase devices. A two-phase submicron gap CCD, described in an article entitled "Charge-Coupled Devices With Submicron Gaps" by V. J. Kapoor, published in IEEE *Electron Device Letters*, Vol. EDL-2, No. 4, page 92, April 1981, suffers from formation of potential wells between the barrier and storage regions within each phase resulting in low transfer efficiency. This is because this device is not a true two-phase structure, but has separate electrodes for the individual barrier and storage regions within each phase. Each of U.S. Pat. No. 4,994,405 (K. M. Jayakar), issued Feb. 19, 1991, application for U.S. Ser. No. 995,393 of E. G. Stevens et al., filed Dec. 18, 1992 and having a common assignee with the present application, and application for U.S. Ser. No. 945,073 of J. P. Lavine, filed Sep. 15, 1992 and having a common assignee with the present application, discloses a method of making a true two-phase CCD having a planar gate electrode structure. Although the method described in each of these applications provides a true two-phase CCD having a planar gate electrode structure, the methods are relatively complex to carry out. Therefore, it would be desirable to have a relatively simple method of making a true two-phase CCD having a single level gate electrode structure so that the gate electrode is planar and has submicron gaps between the gate electrodes.

SUMMARY OF THE INVENTION

The present invention is directed to a method of making a two-phase CCD having a planar gate structure which comprises forming a layer of a conductive material over and insulated from a surface of a body of a semiconductor material of one conductivity type. Sections of a first masking layer are formed over and uniformly spaced along the conducting material layer. A second masking layer is formed over a portion of the surface of the conductive material layer in the spaces between the sections of the first masking layer. Each second masking layer extends from the same end of an adjacent section of the first masking layer and extends over the surface of the conductive material layer toward the other adjacent section of the first masking layer so as to leave a portion of the conductive material layer exposed. The exposed portions of the conductive material layer are removed to divide the conductive material layer into individual gate electrodes.

The invention will be better understood from the following more detailed description and claims taken with the accompanying drawings.

The drawings are not necessarily to scale.

DETAILED DESCRIPTION

Figure 1:
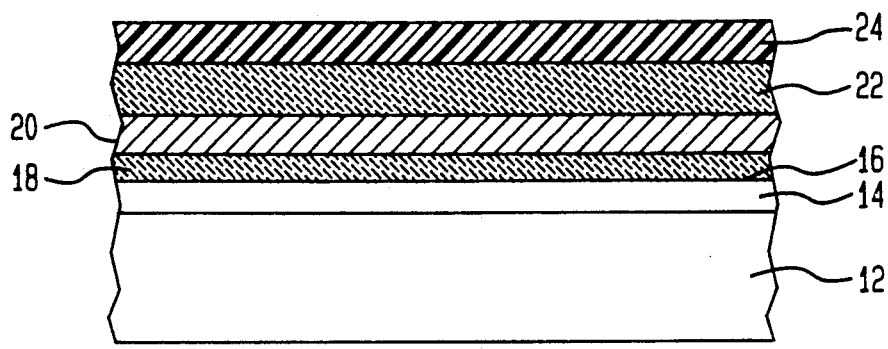
FIGS. 1-8 show sectional views of a CCD in various stages of fabrication in accordance with a method of the present invention.

Referring now to FIG. 1, there is shown a sectional view of a two-phase charge coupled device (CCD) 10 in an initial stage of fabrication in accordance with a method of the present invention. CCD 10 comprises a body 12 of a semiconductor material of one conductivity type, such as p-type conductivity single crystalline silicon. The body 12 is provided with a region 14 therein of the opposite conductivity type, such as n-type conductivity, which extends to and along a surface 16 of the body 12. The region 14 forms the buried channel of the CCD 10. The region 14 may be formed by ion implanting an n-type conductivity dopant into the body 12 through the surface 16 thereof. On the surface 16 of the body 12 is a layer 18 of an insulating material, typically silicon dioxide. The silicon dioxide insulating material layer 18 may be formed by heating the body 12 in an atmosphere containing oxygen to convert a portion of the surface 14 into silicon dioxide.

On the insulating material layer 18 is a layer 20 of a conductive material. For the purpose of this description, the conductive material layer 20 will be described as being formed of indium-tin oxide (ITO). ITO is a transparent conductive material which is highly suitable for forming the gate electrodes of a full-frame and frame-transfer image sensor in which image detector regions are in the channel region 14 of the CCD 10. However, other conductive materials, such as polycrystalline silicon and metal silicides, can also be used for the conductive material layer 20. The ITO layer 20 can be deposited by well known sputtering techniques. On the conductive material layer 20 is a first masking layer 22. The first masking layer 22 is of silicon dioxide deposited by low temperature deposition techniques. For this purpose, the conductive material layer 20 is subjected to a gas containing silicon and oxygen, such as a mixture of silane and either oxygen or steam, and heated at a temperature of about 400° C. to decompose the materials of the gas and form silicon dioxide which deposits on the conductive material layer 20. On the first masking layer 22 is a second masking layer 24 of a photoresist.

Figure 2:
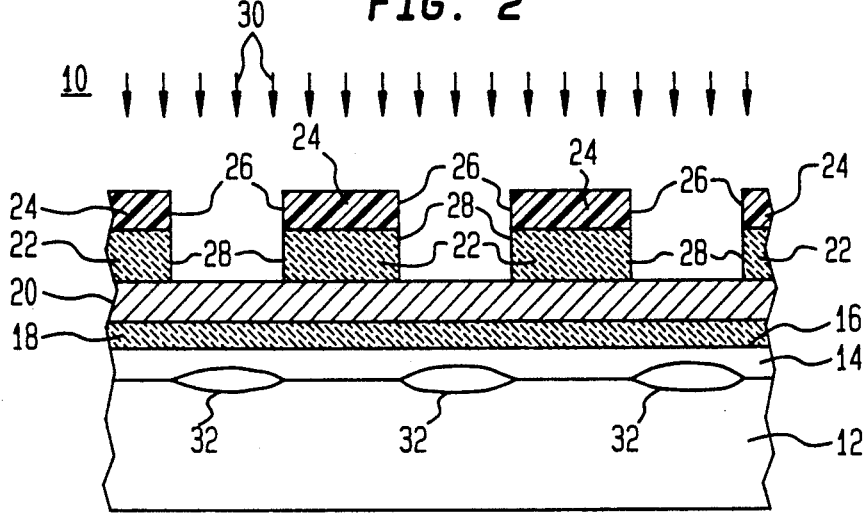

Referring now to FIG. 2, there is shown a sectional view of the CCD 10 in a next stage of fabrication in accordance with the method of the present invention. The photoresist second masking layer 24 is defined, using standard photolithographic techniques, to form openings 26 therethrough. The openings 26 are spaced along the channel region 14. The portions of the silicon dioxide first masking layer 22 at the bottom of the openings 26 are then removed using a suitable anisotropic etch for silicon dioxide. This provides openings 28 in the first masking layer 22 which are spaced along the channel region 14 to divide the first masking layer 22 into a plurality of sections. As indicated by the arrows 30, a dopant of the opposite conductivity type as the channel region 14, i.e., p-type conductivity, are now implanted through the openings 26 and 28, and through insulating layer 18 and conductive layer 20 into the channel region 14. This forms p-type conductivity barrier regions 32 in the channel region 14 which are spaced along the channel region 14 and which extend down to body 12. Alternatively, storage regions may be implanted by using an implant of the same conductivity type as the channel region 14.

Figure 3:
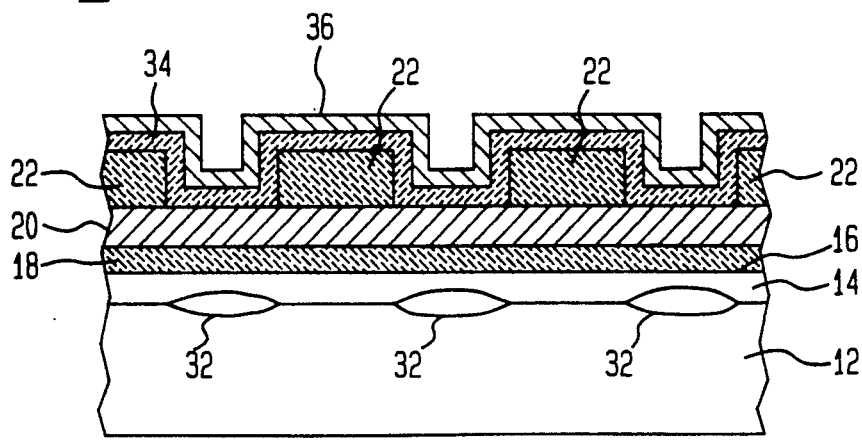

Referring now to FIG. 3, there is shown a sectional view of the CCD 10 in a next stage of fabrication in accordance with the method of the present invention. The photoresist second masking layer 24 is removed. A thin third masking layer 34 of low temperature deposited silicon dioxide is deposited over the sections of the silicon oxide first masking layer 22 and the surface of the conductive layer 20 exposed by the openings 28 in the first masking layer 22. A fourth masking layer 36 of ITO is then deposited over the third masking layer 34. The thickness of the ITO fourth masking layer 36 ultimately determines the width of the gaps between gate electrodes (not shown in FIGS. 1-3, but shown in FIG. 8 by the reference number 46) of the CCD 10.

Figure 4:
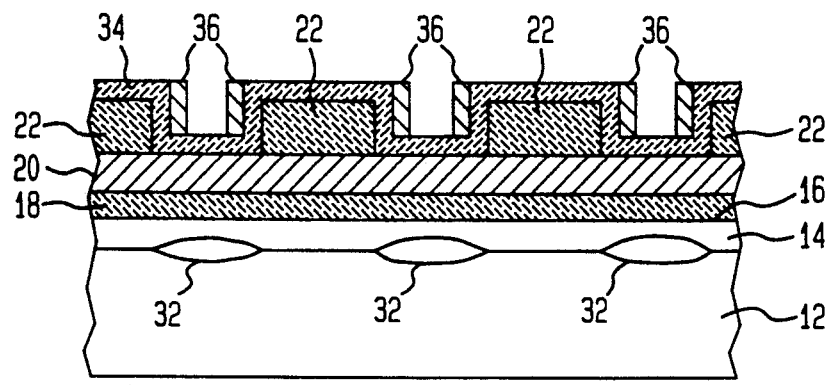

Referring now to FIG. 4, there is shown a sectional view of the CCD 10 in a next stage of fabrication in accordance with the method of the present invention. The ITO fourth masking layer 36 is anisotropically etched using a plasma etch in methane as described in U.S. Pat. No. 5,171,401 (Roselle) issued Dec. 15, 1992 and in U.S. Pat. No. 5,032,221 (Roselle et al.), issued Jul. 16, 1991. This etching of the ITO fourth masking layer 36 removes the fourth masking layer 36 from over the top surfaces of the sections of the first masking layer 22 and from sections of the third masking layer 34 which is in the spaces between the sections of the first masking layer 22. This leaves the fourth masking layer 36 only along the ends of the sections of the first masking layer 22.

Figure 5:
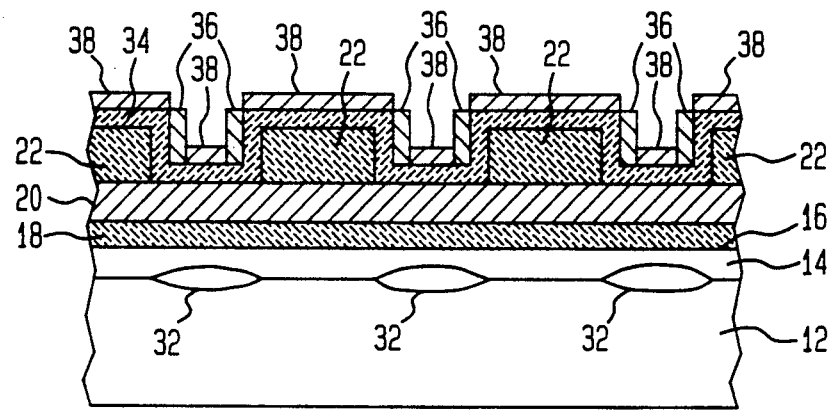

Referring now to FIG. 5, there is shown a sectional view of the CCD 10 in a next stage of the fabrication in accordance with the method of the present invention. Methane based plasma etching of ITO produces volatile indium and tin species that leave the surface of the ITO layer 36 causing the etching of the ITO layer 36. However, as described in the application for U.S. Ser. No. 08/073,211 (P. L. Roselle et al.), filed Jun. 7, 1993 and entitled "Low Temperature Insitu Image Reversal Process For Microelectronics Fabrication", and having a common assignee with the present application, the methane decomposes causing amorphous carbon to deposit on the surface from which the ITO is removed. Thus, as is shown in FIG. 5, the etching of the ITO fourth masking layer 36 by a methane plasma etch technique results in the deposition of a fifth masking layer 38 of amorphous carbon. The carbon fifth masking layer 38 deposits on the exposed portions of the third masking layer 34 over the top surface of the sections of the first masking layer 22 and on the exposed portions of the third masking layer 34 between the remaining portions of the fourth masking layer 36 which are along the ends of the sections of the first masking layer 22.

Figure 6:
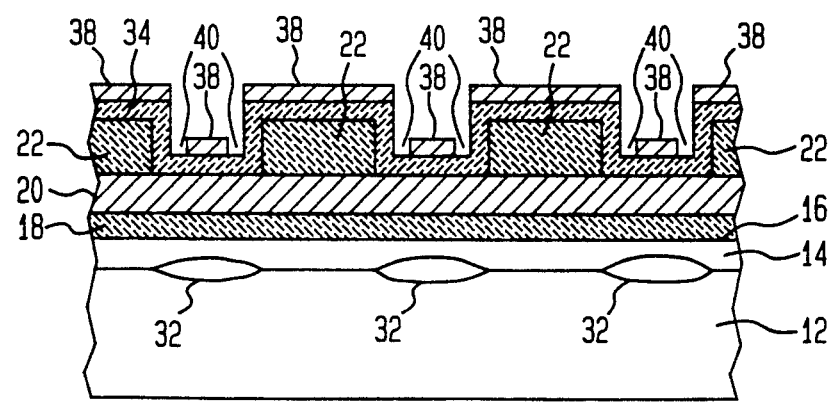

Referring now to FIG. 6, there is shown a sectional view of the CCD 10 in a next stage of the fabrication in accordance with the method of the present invention. The remaining portions of the ITO fourth masking layer 36, which are along the ends of the sections of the first masking layer 22, are now removed with a suitable etchant. This leaves a space 40 between the portions of the carbon fifth masking layer 38, which are between the sections of the first masking layer 22, and the portions of the third masking layer 36 along the ends of the sections of the first masking layer 22 which is of a width equal to the thickness of the ITO fourth masking layer.

Figure 7:
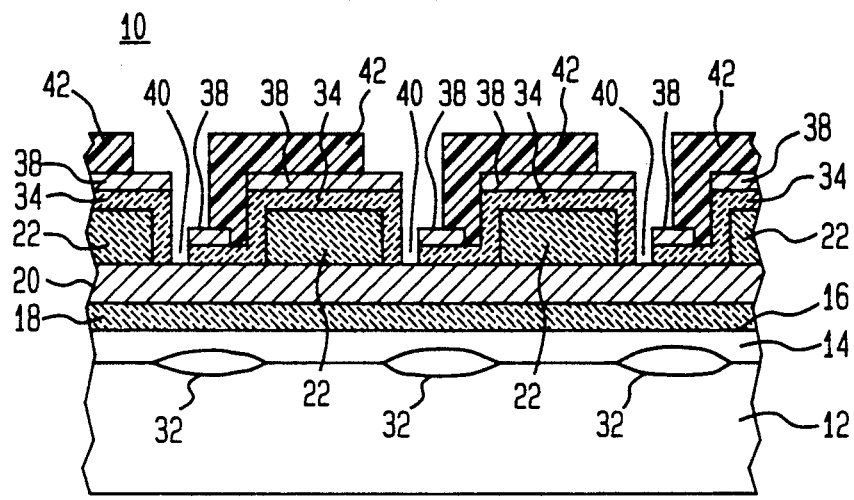

Referring now to FIG. 7, there is shown a sectional view of the CCD 10 in a next stage of the fabrication in accordance with the method of the present invention. A sixth masking layer 42 of a photoresist is then coated over the carbon fifth masking layer 38 and the spaces 40. The sixth masking layer 42 is defined, using standard photolithographic techniques, so that portions of the sixth masking layer 42 extend over portions of the fifth masking layer 38 which are over the top of the sections of the first masking layer 22, a space 40 at only one end of the section of the first masking layer 22 and at least a portion of the portions of the fifth masking layer 38 between the sections of the first masking layer 22. The sixth masking layer 42 extends across the same end of each of the sections of the first masking layer 22. This leaves exposed one of the spaces 40 at the other end of each of the sections of the first masking layer 22, and the portion of the third masking layer 34 in the space 40. The exposed portion of the third masking layer 34 in each exposed space 40 is then removed with a suitable etchant. This exposes portions of the conductive material layer 20 of a width equal to the thickness of the ITO fourth masking layer 36.

Figure 8:
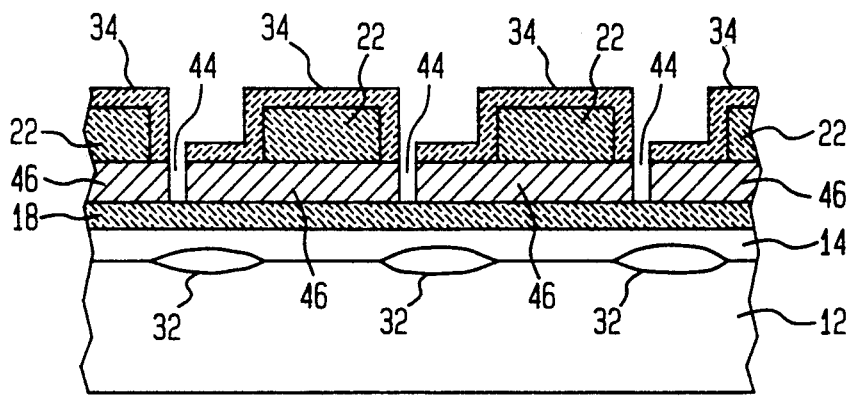

Referring now to FIG. 8, there is shown a sectional view of the CCD 10 in a next stage of fabrication in accordance with the method of the present invention. The photoresist sixth masking layer 42 and the amorphous carbon fifth masking layer 38 are each then removed with a suitable process, such as an oxygen-plasma strip, for both the photoresist and the amorphous carbon. The exposed portions of the conductive material layer 20 are then removed with a suitable anisotropic etch, such as a plasma etch, to form grooves 44 extending through the conductive material layer 20 down to the insulating material layer 18. This divides the conductive material layer 20 into individual gate electrodes 46. The individual gate electrodes 46 are spaced apart by the grooves 44 the width of which is determined by the thickness of the ITO fourth masking layer 36. Since very thin ITO layers can be deposited, the grooves 44 can be submicron gaps. The gate electrodes 46 are positioned so that each has an edge thereof which is over a barrier region 32. Typically, the next steps are to form any peripheral circuitry to be used with the CCD 10, and to complete the CCD 10 in a conventional manner by adding contacts, metalization and passivation as required and as well known in the art.

Thus, there is provided by the present invention a method of making a true two-phase CCD with a planar gate electrode structure. The gap or spacing between the gate electrodes is controlled by the thickness of the indium-tin oxide fourth masking layer 36. Since the indium-tin oxide fourth masking layer 36 can be applied by sputtering, it can be made relatively thin and its thickness can be easily controlled. Thus, the gap between the gate electrodes can be made small, i.e., of submicron length. Also, the method of the present invention has fewer steps as compared to previously known methods for making two-phase CCDs with planar gate electrodes. This reduction in the number of steps is helped by the fact that a single step, i.e., the plasma etch of the ITO layer in a methane gas, achieves both the etching of the ITO layer and the deposition of the amorphous carbon fifth masking layer 38.

It is to be appreciated and understood that the specific embodiments of the invention are merely illustrative of the general principles of the invention. Various modification may be made consistent with the princi-
ples set forth. For example, if a body 12 of n-type conductivity is used, the conductivity of the channel region 14 and the barrier regions 32 would be reversed. Also, instead of implanting the barrier regions 32 immediately after dividing the first masking layer 22 into the individual sections as shown in FIG. 2, the barrier regions 32 can be implanted after the ITO fourth masking layer 36 is etched as is shown in FIG. 4.

What is claimed is:

1. A method of making a two-phase CCD having a planar gate electrode structure comprising the steps of:
    forming a layer of a conductive material over and insulated from a surface of a body of a semiconductor material of one conductivity type;
    forming sections of a first masking layer over and spaced along the conductive material layer;
    forming a second masking layer on a portion of the surface of the conductive material layer between the sections of the first masking layer, each second masking layer extending from the same end of an adjacent section of the first masking layer a distance toward the other adjacent section of the first masking layer so as to leave exposed a portion of the conductive material layer between the sections of the first masking layer; and
    removing the exposed portions of the conductive material layer to divide the conductive material layer into individual gate electrodes.

2. The method of claim 1 further comprising the step of implanting a conductivity modifying dopant into the body through the spaces between the sections of the first masking layer.

3. The method of claim 2 in which the second masking layers are formed by the steps of:
    applying a layer of the material of the second masking layer over the sections of the first masking layer and the surface of the conductive material layer in the spaces between the sections of the first masking layer;
    masking a portion of the second masking layer in the spaces between the sections of the first masking layer; and
    removing the unmasked portions of the second masking layer.

4. The method of claim 3 in which the portions of the second masking layer are removed by the steps of:
    applying a coating of indium-tin oxide over the second masking layer;
    anisotropically etching the indium-tin oxide so as to remove the indium-tin oxide layer from over the top surface of the sections of the first masking layer and a portion of the conductive material layer in the spaces between the sections of the first masking layer but leaving the indium-tin oxide layer along the ends of the sections of the first masking layer;
    applying a layer of amorphous carbon on the portions of the second masking layer from which the indium-tin oxide layer was removed; and then
    removing the portions of the indium-tin oxide layer from along the ends of the sections of the first masking layer.

5. The method of claim 4 in which the indium-tin oxide layer is anisotropically etched in a system which automatically deposits amorphous carbon on place of the removed indium-tin oxide layer.

6. The method of claim 5 in which the indium-tin oxide layer is anisotropically etched in a plasma of methane.

7. The method of claim 4 in which the second masking layer is formed by depositing a layer of silicon dioxide.

8. The method of claim 4 in which after the portions of the indium-tin oxide layer along the ends of the first masking layer are removed, the step of applying a layer of a photoresist between one end of each of the sections of the first masking layer and the amorphous carbon layer which is between the sections of the first masking layer.

9. A method of making a two-phase CCD having a planar gate electrode comprising the steps of:
   forming in a body of a semiconductor material of one conductivity type a channel region of the opposite conductivity type which extends to a surface of the body;
   forming a layer of an insulating material on the surface of the body and over the channel region;
   forming a layer of a conductive material on the insulating material layer;
   forming sections of a first masking layer on the conductive material layer over and spaced along the channel region;
   embedding a conductivity modifier dopant into the channel region through the spaces between the sections of the first masking layer;
   forming a second masking layer on a portion of the surface of the conductive material layer between the sections of the first masking layer, each second masking layer extending from the same end of an adjacent section of the first masking layer toward the other adjacent section of the first masking layer so as to leave a portion of the conductive material layer exposed; and
   removing the exposed portions of the conductive material layer to divide the conductive material layer into individual gate electrodes.

10. The method of claim 9 in which the second masking layers are formed by the steps of:
    applying a layer of the material of the second masking layer over the sections of the first masking layer and the surface of the conductive material layer in the spaces between the sections of the first masking layer;
    masking a portion of the second masking layer in the spaces between the sections of the first masking layer; and
    removing the unmasked portions of the second masking layer.

11. The method of claim 10 in which the portions of the second masking layer are masked by the steps of:
    applying a coating of indium-tin oxide over the second masking layer;
    anisotropically etching the indium-tin oxide layer so as to remove the indium-tin oxide layer from over the top surface of the sections of the first masking layer and a portion of the conductive material layer in the spaces between the sections of the first masking layer but leaving the indium-tin oxide layer along the ends of the sections of the first masking layer;
    applying a layer of amorphous carbon on the portions of the second masking layer from which the indium-tin oxide layer was removed; and then
    removing the portions of the indium-tin oxide layer from along the ends of the sections of the first masking layer.

12. The method of claim 11 in which the indium-tin oxide layer is anisotropically removed in a system which automatically deposits the amorphous carbon in place of the removed indium-tin oxide.

13. The method of claim 12 in which the indium-tin oxide layer is etched in a plasma of methane.

14. The method of claim 11 in which after the portions of the indium-tin oxide layer along the ends of the sections of the first masking layer are removed, the step of:
    applying a layer of a photoresist between one end of the sections of the first masking layer and the amorphous carbon layer which is between the sections of the first masking layer.

15. The method of claim 11 in which the second masking layer is formed by depositing a layer of silicon dioxide.

16. The method of claim 11 in which the sections of the first masking layer are formed by the steps of:
    applying a layer of silicon dioxide over the conductive material layer;
    applying a photoresist layer on the portions of the silicon dioxide layer which are to form the sections of the first masking layer; and
    removing the portions of the first masking layer not covered by the photoresist.

* * * * *